(12) United States Patent
Koide et al.

(10) Patent No.: US 7,939,349 B2
(45) Date of Patent: May 10, 2011

(54) NITRIDE-BASED SEMICONDUCTOR LIGHT EMITTING DEVICE AND MANUFACTURING METHOD THEREOF

(75) Inventors: Norikatsu Koide, Nagoya (JP); Toshio Hata, Nara (JP); Mayuko Fudeta, Mihara (JP); Daigaku Kimura, Mihara (JP)

(73) Assignee: Sharp Kabushiki Kaisha, Osaka-shi (JP)

( * ) Notice: Subject to any disclaimer, the term of this patent is extended or adjusted under 35 U.S.C. 154(b) by 0 days.

(21) Appl. No.: 11/494,845

(22) Filed: Jul. 27, 2006

(65) Prior Publication Data

US 2006/0267033 A1 Nov. 30, 2006

Related U.S. Application Data

(63) Continuation of application No. 10/422,404, filed on Apr. 23, 2003, now Pat. No. 7,154,125.

(30) Foreign Application Priority Data

Apr. 23, 2002 (JP) ................................ 2002-120576

(51) Int. Cl.
*H01L 21/00* (2006.01)
(52) U.S. Cl. ........ 438/22; 438/29; 257/98; 257/E33.028; 257/E33.064; 257/E33.065; 257/E33.68; 257/E33.074
(58) Field of Classification Search ............ 257/94–103, 257/13–19, 76–82; 438/22, 29
See application file for complete search history.

(56) References Cited

U.S. PATENT DOCUMENTS

| 5,792,698 | A | 8/1998 | Nishitani |
| 6,060,730 | A | 5/2000 | Tsutsui |
| 6,133,589 | A | 10/2000 | Krames et al. |
| 6,303,405 | B1 | 10/2001 | Yoshida et al. |
| 6,441,403 | B1 | 8/2002 | Chang et al. |
| 8,495,862 | | 12/2002 | Okazaki et al. |
| 6,735,230 | B1 | 5/2004 | Tanabe et al. |
| 2001/0028100 | A1 | 10/2001 | Schmitz et al. |
| 2001/0028667 | A1 | 10/2001 | Kaneko |
| 2002/0117672 | A1 | 8/2002 | Chu et al. |
| 2002/0136932 | A1 | 9/2002 | Yoshida |
| 2003/0222263 | A1* | 12/2003 | Choi .............................. 257/79 |
| 2004/0026709 | A1 | 2/2004 | Bader et al. |
| 2004/0056254 | A1 | 3/2004 | Bader et al. |

(Continued)

FOREIGN PATENT DOCUMENTS

JP 08-167735 6/1996

(Continued)

OTHER PUBLICATIONS

Chinese Office Action mailed on Aug. 6, 2004, for Patent Application No. 03123236. 1, 15 pages.

(Continued)

*Primary Examiner* — Ahmed Sefer
(74) *Attorney, Agent, or Firm* — Morrison & Foerster LLP

(57) ABSTRACT

The nitride-based semiconductor light-emitting device and manufacturing method thereof are disclosed: the nitride-based semiconductor light-emitting device includes a reflective layer formed on a support substrate, a p-type nitride-based semiconductor layer, a light-emitting layer and an n-type nitride-based semiconductor layer successively formed on the reflective layer, wherein irregularities are formed on a light extracting surface located above the n-type nitride-based semiconductor layer.

3 Claims, 12 Drawing Sheets

U.S. PATENT DOCUMENTS

| | | | |
|---|---|---|---|
| 2004/0077114 A1* | 4/2004 | Coman et al. | 438/46 |
| 2006/0054898 A1 | 3/2006 | Lai et al. | |
| 2007/0290225 A1* | 12/2007 | Lee et al. | 257/103 |

FOREIGN PATENT DOCUMENTS

| | | |
|---|---|---|
| JP | 10-041586 A | 2/1998 |
| JP | 11-068157 A | 3/1999 |
| JP | 11-168236 | 6/1999 |
| JP | 2000-101139 | 4/2000 |
| JP | 2000-174333 A2 | 6/2000 |
| JP | 2000-196152 A | 7/2000 |
| JP | 2001-7393 | 1/2001 |
| JP | 2001-168472 | 6/2001 |
| JP | 2001-313422 A | 11/2001 |
| JP | 2002-289970 A2 | 10/2002 |
| TW | 0472400 B | 1/2002 |
| WO | WO-98/42030 A1 | 9/1998 |
| WO | WO-01/82384 | 11/2001 |
| WO | WO 01/84640 * | 11/2001 |
| WO | WO-01/84640 A1 | 11/2001 |

OTHER PUBLICATIONS

Koide et al., U.S. Office Action mailed Apr. 7, 2004, directed to U.S. Appl. No. 10/422,404; 7 pages.

Koide et al., U.S. Office Action mailed Sep. 14, 2004, directed to U.S. Appl. No. 10/422,404; 7 pages.

Koide et al., U.S. Office Action mailed Dec. 22, 2004, directed to U.S. Appl. No. 10/422,404; 7 pages.

Koide et al., U.S. Office Action mailed Jun. 2, 2005, directed to U.S. Appl. No. 10/422,404; 10 pages.

Koide et al., U.S. Office Action mailed Nov. 16, 2005, directed to U.S. Appl. No. 10/422,404; 11 pages.

Koide et al., U.S. Office Action mailed Apr. 7, 2006, directed to U.S. Appl. No. 10/422,404; 11 pages.

* cited by examiner

NITRIDE-BASED SEMICONDUCTOR LIGHT EMITTING DEVICE AND MANUFACTURING METHOD THEREOF

CROSS-REFERENCE TO RELATED APPLICATIONS

This application is a continuation of U.S. application Ser. No. 10/422,404, filed Apr. 23, 2003, which claims priority to Japanese Patent Application No. JP2002-120576, filed Apr. 23, 2002, the disclosures of each of which are incorporated herein by reference in their entirety.

BACKGROUND OF THE INVENTION

1. Field of the Invention

The present invention relates to a nitride-based semiconductor light-emitting device using a nitride-based semiconductor represented by the general formula $In_xAl_yGa_{1-x-y}N$ ($x+y+z=1$, $0 \leq x \leq 1$, $0 \leq y \leq 1$ and $0 \leq z \leq 1$) and a manufacturing method thereof.

2. Description of the Background Art

The conventional nitride-based semiconductor light-emitting devices are mostly fabricated by layering a nitride-based semiconductor layer on a sapphire substrate. In recent years, however, for the reduction of manufacturing cost of the light-emitting device, the use of silicon (Si) substrate have become common as the silicon substrate is less expensive and usable by a large area.

FIG. 12 shows a schematic perspective of a conventional nitride-based semiconductor light-emitting device using an Si substrate. The nitride-based semiconductor light-emitting device includes on an Si substrate 100, an AlN buffer layer 101, an n-type GaN layer 102, an InGaN light-emitting layer 103, a p-type AlGaN carrier block layer 104 and a p-type GaN contact layer 105 successively layered, a translucent electrode 106 formed on p-type GaN contact layer 105, and an n-type-use electrode 107 formed on n-type GaN layer 102. Further, a p-type-use pad electrode 108 is formed on translucent electrode 106 and an n-type-use pad electrode 109 is formed on n-type-use electrode 107.

In this nitride-based semiconductor light-emitting device, however, a part of light emitted from InGaN light-emitting layer 103 is directed towards Si substrate 100 and absorbed by Si substrate 100, whereby light extraction efficiency of the light emitted from InGaN light-emitting layer 103 is decreased.

It may be possible to form a reflective film on Si substrate 100 from materials such as metals to prevent the incidence of light to Si substrate 100 and to extract the light from the side surface of the semiconductor light-emitting device in the same manner as in a device with a sapphire substrate. However, the nitride-based semiconductor layer cannot be formed thick as the difference in thermal expansion coefficient between nitride-based semiconductor layers causes crack. Hence, it is impossible to improve light extraction efficiency by extracting light from the side surface of the nitride-based semiconductor layer using this portion to let the light emitted from the light-emitting layer pass through for the extraction.

To solve the problem as described above, Japanese Patent Laying-Open No. 2000-196152 discloses a light-emitting device including a p-type GaN semiconductor layer with irregularities and a light-emitting device including a light extraction layer with an irregular surface formed on a p-type GaN semiconductor layer via a transparent electrode. When the film thickness of the p-type GaN semiconductor layer is increased for the formation of irregularities, many cracks are formed in the p-type GaN semiconductor layer thereby increasing the driving voltage of the device. It is assumed that when the p-type GaN semiconductor layer is grown at a high temperature and brought back to room temperature after the growth, tensile stress applied on the p-type GaN semiconductor layer causes cracks and that the thickness of the film of the p-type GaN semiconductor layer also contributes to the liability of crack formation. In addition, the p-type GaN semiconductor layer has a further disadvantage as it is unlikely to be low in resistance essentially and because of the film thickness, which leads to a further increase in the driving voltage of the device. Further, even when the transparent electrode is formed on the p-type GaN semiconductor layer, ohmic characteristics between the p-type GaN semiconductor layer and the transparent electrode is not favorable and contact resistance tends to become high, whereby the driving voltage of the device increases.

SUMMARY OF THE INVENTION

In order to achieve the objects as described above, a nitride-based semiconductor light-emitting device according to the present invention includes: a reflective layer formed on a support substrate; a p-type nitride-based semiconductor layer, a light-emitting layer and an n-type nitride-based semiconductor layer successively formed on the reflective layer; wherein a light extracting surface located above the n-type nitride-based semiconductor layer has irregularities. Here in the present invention, the light extracting surface located above the n-type nitride-based semiconductor layer may locate on an upper surface of the n-type nitride-based semiconductor layer or on an upper surface of a layer located above the n-type nitride-based semiconductor layer.

Here in the nitride-based semiconductor light-emitting device according to the present invention, it is preferable that a high refractive index film including one selected from a group consisting of silicon nitride ($Si_3N_4$), indium oxide ($In_2O_3$), neodymium oxide ($Nd_2O_2$), zirconium oxide ($ZrO_2$), titanium oxide ($TiO_2$), cerium oxide ($CeO_2$) and bismuth oxide ($BiO_3$) is formed on the n-type nitride-based semiconductor layer, and an upper surface of the high refractive index film is the light extracting surface.

Further, in the nitride-based semiconductor light-emitting device according to the present invention, it is preferable that a nitride-based semiconductor layer represented by $In_aGa_{1-a}N$ ($0<a \leq 1$) is formed on the n-type nitride-based semiconductor layer and an upper surface of the nitride-based semiconductor layer represented by $In_aGa_{1-a}N$ ($0<a \leq 1$) is the light extracting surface.

Still further, in the nitride-based semiconductor light-emitting device according to the present invention, the maximum thickness of the nitride-based semiconductor layer represented by $In_aGa_{1-a}N$ ($0<a \leq 1$) is preferably in the range of 200 to 800 nm.

Additionally, in the nitride-based semiconductor light-emitting device according to the present invention, it is preferable that a silicon-doped nitride-based semiconductor layer represented by $In_aGa_{1-a}N$ ($0<a \leq 1$) is formed on the n-type nitride-based semiconductor layer, an upper surface of the silicon-doped nitride-based semiconductor layer is the light extracting surface, and a concentration of silicon contained in the silicon-doped nitride-based semiconductor layer is in the range of $5 \times 10^{20} \sim 5 \times 10^{21}$ cm$^{-3}$.

Further, in the nitride-based semiconductor light-emitting device according to the present invention, it is preferable that the support substrate is formed by nickel plating and the reflective layer is a p-type-use electrode.

Still further, the present invention is a method of manufacturing the nitride-based semiconductor light-emitting device and includes the steps of: preparing a silicon substrate and successively forming an n-type nitride-based semiconductor layer, a light-emitting layer, and a p-type nitride-based semiconductor layer on the silicon substrate; forming a reflective layer on the p-type nitride-based semiconductor layer and forming a support substrate on the reflective layer; inverting a wafer using the support substrate; removing the silicon substrate; and forming a light extracting surface with irregularities above the n-type nitride-based semiconductor layer.

Here in the method of manufacturing the nitride-based semiconductor light-emitting device according to the present invention, the irregularities of the light extracting surface are preferably formed through regrowth of the n-type nitride-based semiconductor layer.

In addition, in the method of manufacturing the nitride-based semiconductor light-emitting device according to the present invention, the irregularities of the light extracting surface is preferably formed through polishing.

In addition, in the method of manufacturing the nitride-based semiconductor light-emitting device according to the present invention, the irregularities of the light extracting surface is preferably formed through partial etching.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
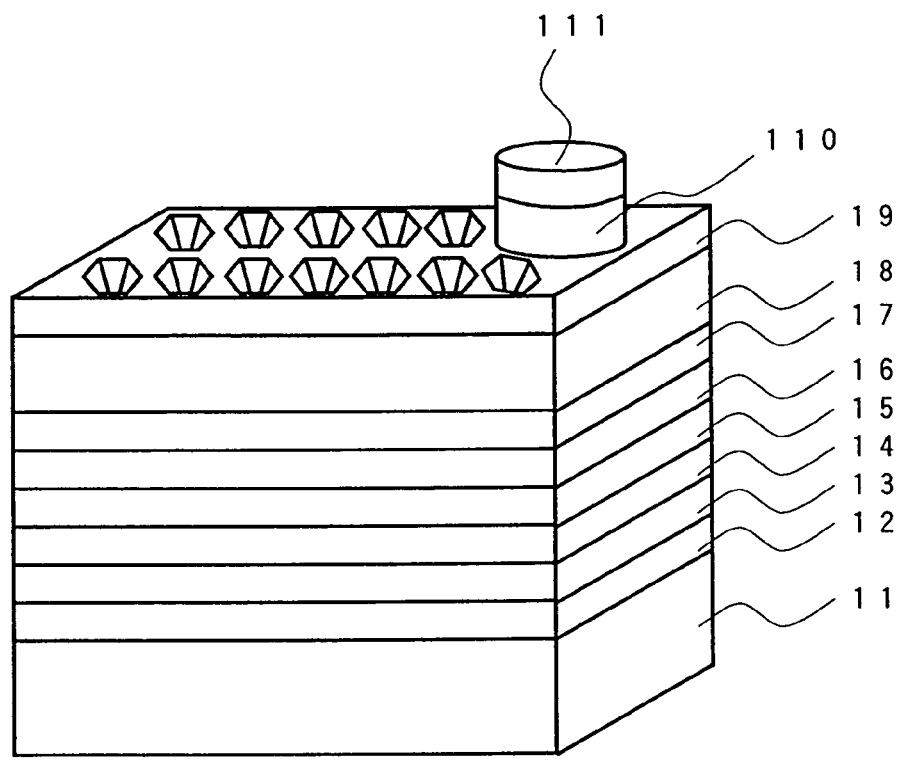
FIG. 1 is a schematic perspective of a nitride-based semiconductor light-emitting device of a first embodiment.

In the following, embodiments of the present invention will be described.

(Light Extracting Surface)

The nitride-based semiconductor light-emitting device of the present invention is characterized in that a light extracting surface with an irregular surface is located above an n-type nitride-based semiconductor layer. When the light extracting surface is flat, of the light emitted from a light-emitting layer, the light incident on the light extracting surface at a normal angle, which is larger than critical refracting angle, is fully reflected at the light extracting surface. When the light extracting surface has irregularities, these light can also be extracted to outside, whereby light extraction efficiency can be improved.

In addition, when irregularities are formed on the upper surface of the p-type nitride-based semiconductor layer as in the conventional art, the p-type nitride-based semiconductor layer, which is high in resistance, is formed thick, to increase series resistance and driving voltage. When the light extracting surface is formed on the upper surface of the n-type nitride-based semiconductor layer, which is low in resistance, as in the present invention, even when the n-type nitride-based semiconductor layer is formed thick, the driving voltage of the device can be suppressed due to the conductivity of the n-type nitride-based semiconductor layer. In addition, even when a transparent electrode layer is provided on the n-type nitride-based semiconductor layer, electric resistance would not increase much, and the driving voltage of the device does not significantly differ from the driving voltage of a device without the transparent electrode layer.

Further, though the light extracting surface can be formed on the upper surface of the n-type nitride-based semiconductor layer, it is possible to form a high refractive index film composed of one selected from a group consisting of $Si_3N_4$, $In_2O_3$, $Nd_2O_2$, $ZrO_2$, $TiO_2$, $CeO_2$ and $BiO_3$ on the n-type nitride-based semiconductor layer and to use the upper surface of the high refractive index film as the light extracting surface. The high refractive index film has a smaller critical refractive index than the n-type nitride-based semiconductor layer, which allows the extraction of more light, whereby light extraction efficiency can be improved. In addition, as direct processing of the n-type nitride-based semiconductor layer is not necessary, the reduction of driving voltage of the device can be achieved to an extent equal to or more than in the case where the light extracting surface is the upper surface of the n-type nitride-based semiconductor layer.

Further, it is possible to form a nitride-based semiconductor layer represented by $In_aGa_{1-a}N$ ($0<a\leq1$) on the n-type nitride-based semiconductor layer to use the upper surface of the nitride-based semiconductor layer represented by $In_aGa_{1-a}N$ ($0<a\leq1$) as the light extracting surface. As the $In_aGa_{1-a}N$ layer has a smaller refractive index than the GaN layer, light extraction efficiency can be improved. Further, as the $In_aGa_{1-a}N$ layer has a lower crystallinity than the GaN layer, fabrication of the irregularities may be easier.

Here, the maximum thickness of the nitride-based semiconductor layer of $In_aGa_{1-a}N$ ($0<a\leq1$) is preferably in the range of 200~800 nm. Considering the facts that for the improvement of light extraction efficiency, the film thickness needs to be close to the wavelength of the light emitted from the light-emitting layer and that the dimension of irregularities needs to be larger than the wavelength of the emitted light divided by the refractive index in the nitride-based semiconductor layer, the maximum thickness of the layer is preferably in the range of 200~800 nm. When the maximum thickness of the layer is below 200 nm, total reflection becomes likely and the light extraction efficiency tends to decrease, whereas when the maximum thickness is above 800 nm, distortion caused by the regrowth of the layer leads to the generation of crack and leak current between n and p, and the light extraction efficiency tends to decrease.

Further, it is preferable that an Si-doped nitride-based semiconductor layer represented by $In_aGa_{1-a}N$ ($0<a\leqq1$) is formed on the n-type nitride-based semiconductor layer, that the upper surface of the Si-doped nitride-based semiconductor layer is the light extracting surface and that the concentration of Si contained in the Si-doped nitride-based semiconductor layer is in the range of $5\times10^{20}$~$5\times10^{21}$ cm$^{-3}$. In this case also light extraction efficiency may be improved. Further, when the Si concentration is in the range of $5\times10^{20}$~$5\times10^{21}$ cm$^{-3}$ the light extracting surface can more easily be formed in a pyramid shape. When the Si concentration is below $5\times10^{20}$ cm$^{-3}$, it is difficult to form pyramid-shaped irregularities and when the Si concentration is above $5\times10^{21}$ cm$^{-3}$, crystal growth is difficult to occur and a film cannot always be formed.

In addition, a translucent electrode of one of metals selected from a group consisting of aluminium (Al), titanium (Ti), zirconium (Zr), hafnium (Hf), vanadium (V), niobium (Nb) and indium-tin oxide (ITO) can be provided on the light extracting surface with irregularities. In this case, current injected into the device can be spread more in the device.

(Irregularities)

Though the shape and the number of irregularities to be formed on the light extracting surface is not particularly limited, irregularities can take the following forms: a form where numerous holes like craters are formed on the light extracting surface; a form where the light extracting surface protrudes like a barrel roof; a form where triquetrous poles are horizontally arranged at an interval on the light extracting surface; and a form where a triquetrous poles are arranged without a gap therebetween on the light extracting surface.

As a method for fabricating the irregularities, the following methods can be employed, for example: a method of growing an n-type nitride-based semiconductor layer, and regrowing the n-type nitride-based semiconductor layer through adjustment of growth temperature, amount of gas introduction and growth rate as required; a method of forming a mask of $SiO_2$, $Si_3N_4$ and the like on the n-type nitride-based semiconductor layer and selectively regrowing the n-type nitride-based semiconductor layer; and a method of polishing the n-type nitride-based semiconductor layer using diamond grain or alumina grain.

Alternative methods of fabrication include, for example: a method of applying grains such as diamond grain or alumina grain and partially etching the n-type nitride-based semiconductor layer by RIE (reactive ion etching); and a method of performing a heat treatment on the n-type nitride-based semiconductor layer after the formation of mask pattern and vertically etching the mask by RIE. Further, when the mask is formed to leave unmasked portion in the shape of stripes with an approximately 1 μm width, it is possible to form irregular structure of tapers through an appropriate control of etching condition. Further, it is possible to form both the barrel roof shape light extracting surface and the tapered irregular structure through heat treatment as well as the control of etching condition. Here, taper means a V-shaped groove.

(Support Substrate)

The material employed for a support substrate of the present invention is not particularly limited. It is possible to form a support substrate from a metal plating such as Ni, Au, an alloyed metal consisting of Au and Sn, a semiconductor substrate of electrically conductive Si, GaAs, GaP, InP and the like which is fused by adhesive metal consisting of Pd and In. Particularly, the support substrate is preferably formed from Ni plating. Then, the support substrate can be fabricated at a low cost.

(Reflective Layer)

The reflective layer employed in the present invention is preferably formed from Ag which has the highest reflectivity in view of light extraction efficiency.

Further, in view of the reduction of the driving voltage of the device, the reflective layer is preferably a p-type-use electrode in ohmic contact with the p-type nitride-based semiconductor layer. Here, as the material for the reflective layer as the p-type-use electrode, for example, Pd, Ni, Ag and the like can be employed, among these Pd is preferable. With regard to the driving voltage, though these materials show little difference at the normally employed driving current of 20 mA, when Pd is employed the driving voltage of the device can be reduced, though not much.

Hence, more preferably the reflective layer is formed as a p-type-use electrode where Au is vapor deposited on Pd or a p-type-use electrode where Au is vapor deposited on Ag, and most preferably is a p-type-use electrode where Ag and Au are successively formed on Pd and which is capable of reflecting light.

(P-Type Nitride-Based Semiconductor Layer)

As a material for the p-type nitride-based semiconductor layer employed in the present invention, a product obtained by injecting a p-type dopant to a nitride-based semiconductor represented by the general formula $In_xAl_yGa_{1-x-y}N$ ($x+y+z=1$, $0\leqq x\leqq1$, $0\leqq y\leqq1$ and $0\leqq z\leqq1$) is employed. As a p-type dopant, a conventionally known material can be employed, for example, one or more of Mg, Zn, Cd, Be or the like can be employed.

Here in the present invention, the p-type nitride-based semiconductor layer may mean one layer among a plurality of layered p-type layers or the plurality of layered p-type layers as a whole.

(Light-Emitting Layer)

As a material for the light-emitting layer employed in the present invention, a nitride-based semiconductor represented by the general formula $In_xAl_yGa_{1-x-y}N$ ($x+y+z=1$, $0\leqq x\leqq1$, $0\leqq y\leqq1$ and $0\leqq z\leqq1$) can be used. In addition, the light-emitting layer employed in the present invention can be either an MQW (multiple quantum well) light-emitting layer or an SQW (single quantum well) light-emitting layer. The effects of the present invention can similarly be obtained when the light-emitting layer is formed as a group III-V element nitride-based semiconductor mainly containing N as a group V element, such as InGaAlN, InGaN, GaN, GaAsN, GaInAsN, GaPN, GaInPN.

(N-Type Nitride-Based Semiconductor Layer)

As a material for the n-type nitride-based semiconductor layer employed in the present invention, a product obtained by injecting an n-type dopant to a nitride-based semiconductor represented by the general formula $In_xAl_yGa_{1-x-y}N$ ($x+y+z=1$, $0\leqq x\leqq1$, $0\leqq y\leqq1$ and $0\leqq z\leqq1$) is employed. Here, a conventionally known material can be used as the n-type dopant, for example, one or more of Si, oxygen (O), chlorine (Cl), sulfur (S), carbon (C), germanium (Ge) or the like can be employed.

In the present invention, the n-type nitride-based semiconductor layer may mean one layer of a plurality of n-type layers or the plurality of n-type layers as a whole.

(Manufacturing Method)

A method of manufacturing a nitride-based semiconductor light-emitting device of the present invention includes the steps of: preparing a silicon substrate and successively forming an n-type nitride-based semiconductor layer, a light-emitting layer, and a p-type nitride-based semiconductor layer on the silicon substrate; forming a reflective layer on the p-type nitride-based semiconductor layer and forming a support substrate on the reflective layer; inverting a wafer using the support substrate; removing the silicon substrate; and forming a light extracting surface with irregularities on its surface above the n-type nitride-based semiconductor layer.

In the conventional art, irregularities are provided on the upper portion of the p-type nitride-based semiconductor layer. The present invention, however, is characterized in that the n-type nitride-based semiconductor layer, the light-emitting layer and the p-type nitride-based semiconductor layer are formed in this order on the Si substrate, then the support substrate is provided on the p-type nitride-based semiconductor layer to invert the wafer, and the Si substrate is removed to form the light extracting surface with irregularities on the n-type nitride-based semiconductor layer.

Hence, when the nitride-based semiconductor light-emitting device is fabricated according to the manufacturing method of the present invention, even if the film thickness of the n-type nitride-based semiconductor layer is increased for the formation of irregular surface of the n-type nitride-based semiconductor layer, the driving voltage of the device can be significantly reduced compared with the conventional art as described above. Further, as the support substrate also function as the substitute for the electrode, upper and lower electrodes structure of the light-emitting device can easily be fabricated, whereby more compact light-emitting device can easily be achieved.

For layering the nitride-based semiconductor layers, conventionally known methods can be employed, for example: Liquid Phase Epitaxy (LPE), Vapor Phase Epitaxy (VPE), Metal-Organic Chemical Vapor Deposition (MOCVD), Molecular Beam Epitaxy (MBE), Gas Source MBE, or the combination thereof. Further, as a method for forming the reflective layer, the support substrate or the electrode, the following can be employed, for example: vacuum evaporation, sputtering, electrolytic plating, electroless plating or the combination thereof.

EXAMPLE

In the following, the present invention will be described in detail in conjunction with embodiments, however, the present invention is not limited thereto.

First Embodiment

FIG. 1 shows a schematic perspective of the nitride-based semiconductor light-emitting device of the first embodiment of the present invention. The nitride-based semiconductor light-emitting device of the embodiment includes on a support substrate 11 of Ni plating functioning also as an electrode, a p-type-use electrode 12, and further a p-type GaN clad layer 13, a p-type AlGaInN carrier block layer 14, a light-emitting layer 15 of $In_xGa_{1-x}N$, an Si-doped n-type $In_{0.03}Ga_{0.97}N$ clad layer 16, an Si-doped n-type $In_{0.1}Ga_{0.9}N$ layer 17 and an Si-doped n-type GaN layer clad layer 18 successively formed on p-type-use electrode 12. Further, an n-type GaN light extracting layer 19 having irregularities formed through regrowth is formed on an upper surface of n-type GaN clad layer 18 and an n-type-use electrode 110 and an n-type-use bonding electrode 111 are formed in a portion of n-type GaN light extracting layer 19.

Figure 2:
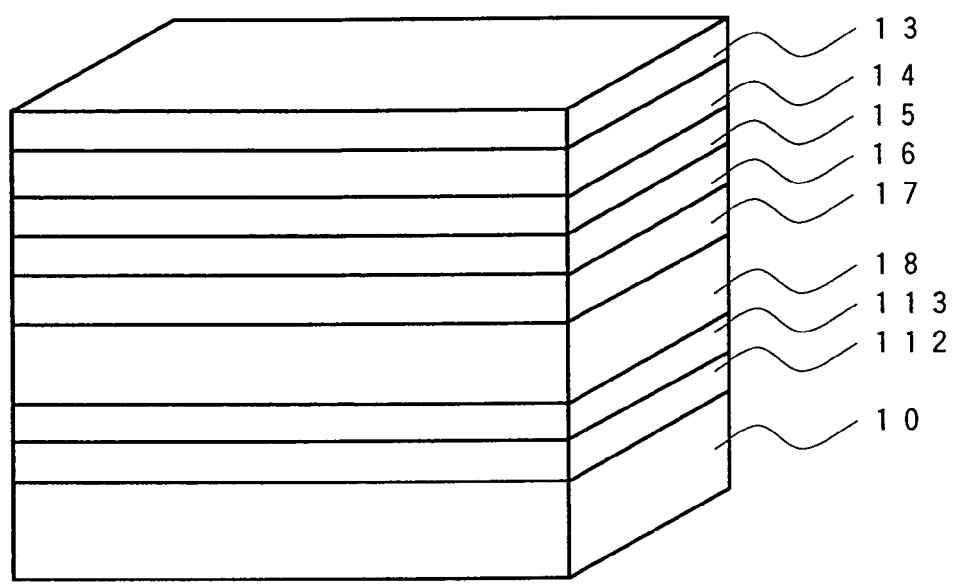
FIG. 2 is a schematic perspective of a wafer including nitride-based semiconductor layers of the first embodiment after the formation of a p-type clad layer.

In the following, with reference to FIGS. 2 and 3, the method of manufacturing the nitride-based semiconductor light-emitting device of the embodiment will be described. First, an Si (111) substrate 10 which is slightly cut off by about 1° is washed through organic cleaning and further with 5% HF solution for one minute, introduced into an MOCVD apparatus and cleaned at a high temperature of about 900° C. in the hydrogen ($H_2$) atmosphere.

Then, while $H_2$ as a carrier gas is being drawn into the apparatus at the rate of 10 L/min, at 1200° C. $NH_3$ at the rate of 5 L/min and trimethylaluminium (TMA) at the rate of 20 μmol/min are introduced into the apparatus to grow an AlN buffer layer 112 of 200 nm thickness on Si substrate 10 as shown in FIG. 2.

Next, while $H_2$ as a carrier gas is being drawn into the apparatus at the rate of 10 L/min, at 1150° C. $NH_3$ at the rate of 5 L/min, TMA at the rate of 20 μmol/min, and trimethylgallium (TMG) at the rate of 20 μmol/min are introduced into the apparatus to grow an Si-doped $Al_{0.5}Ga_{0.5}N$ layer 113 of 150 nm in thickness.

Next, while $H_2$ as a carrier gas is being drawn into the apparatus at the rate of 10 L/min, at 1150° C. $NH_3$ at the rate of 5 L/min and TMG at the rate of 20 μmol/min are introduced into the apparatus and further $SiH_4$ gas is introduced, to grow Si-doped n-type GaN layer 18 of 1 μm in thickness.

Then, the growth temperature is decreased to 910° C. and TMG at the rate of 20 μmol/min and trimethylindium (TMI) at the rate of 20 μmol/min are introduced into the apparatus to grow Si-doped $In_{0.1}Ga_{0.9}N$ layer 17 of 300 nm in thickness.

Then, through the reduction of introduced amount of TMI into the apparatus down to approximately 5 μmol/min, Si-doped $In_{0.03}Ga_{0.97}N$ clad layer 16 of 20 nm in thickness is grown.

Then, the supply of $SiH_4$ is stopped, the substrate temperature is decreased down to 760° C. and TMI at the rate of 6.5 μmol/min and TMG at the rate of 2.8 μmol/min are introduced into the apparatus to grow a well layer of $In_{0.18}Ga_{0.82}N$ of 3 nm in thickness. Thereafter, the temperature is raised again up to 850° C. and TMG is introduced into the apparatus at the rate of 14 μmol/min to grow a barrier layer of GaN. Similarly, the growth of a well layer and a barrier layer is repeated to grow light-emitting layer 15 of InGaN of a multiple quantum well (MQW) including four pairs of well layer and barrier layer. Here, through the variation of composition x of $In_xGa_{1-x}N$ of the $In_xGa_{1-x}N$ light-emitting layer, the wavelength of interband light emission can be varied to emit the light ranging from ultraviolet to red. In this embodiment it is assumed that blue light is emitted.

After the completion of the growth of light-emitting layer 15, at the same temperature as the last barrier layer, TMG at the rate of 11 μmol/min, TMA at the rate of 1.1 μmol/min, TMI at the rate of 40 μmol/min, and biscyclopentadienyl magnesium ($Cp_2Mg$) which is a p-type doping material gas at the rate of 10 nmol/min are introduced into the apparatus to grow Mg-doped p-type carrier block layer 14 of an $Al_{0.20}Ga_{0.75}In_{0.05}N$ layer of 50 nm in thickness. After the completion of the growth of p-type carrier block layer 14, temperature is raised to 1000° C. and the introduction of TMA to the apparatus is stopped to grow Mg-doped p-type clad layer 13 of a GaN layer of 100 nm in thickness.

When the growth of the nitride-based semiconductor layer is completed as described above, the supply of TMG, $Cp_2Mg$ and the like is stopped and the wafer is cooled down to room temperature and removed out of the MOCVD apparatus.

Next, after the vapor deposition of Pd to the thickness of 5 nm on p-type clad layer 13 as p-type-use electrode 12 with Electron Beam (EB) vapor deposition apparatus, Au is deposited to 500 nm. Then, Ni plating of 100 μm is formed on p-type-use electrode 12 by electrolytic plating to provide support substrate 11.

Figure 3:
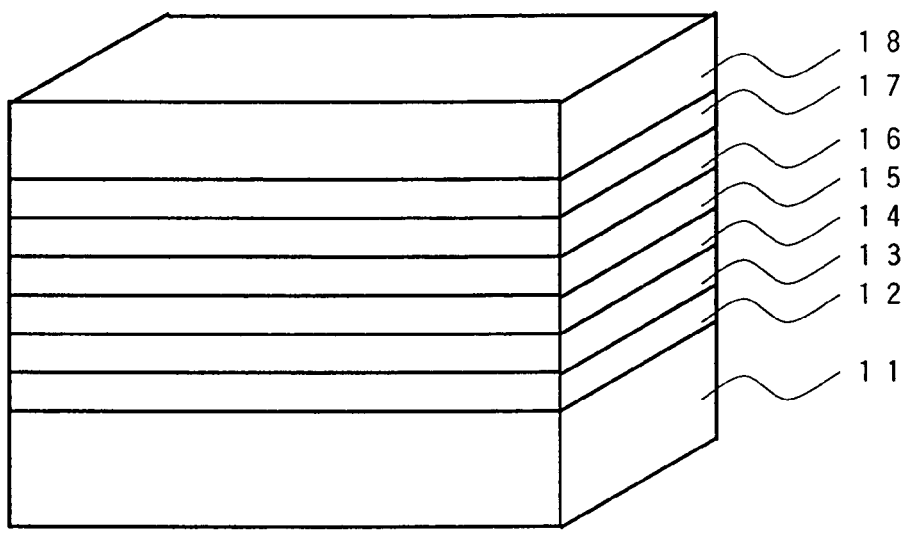
FIG. 3 is a schematic perspective of a wafer including nitride-based semiconductor layers of the first embodiment after the removal of an Si substrate.

Then, as shown in FIG. 3, the wafer is inverted using support substrate 11 and Si substrate 10 is removed through the etching with an etchant of HF and $HNO_3$ and AlN buffer layer 112 and $Al_{0.5}Ga_{0.5}N$ layer 113 are removed through RIE.

Then, the wafer without the Si substrate and other elements is set in the MOCVD apparatus and the surface of the wafer is cleaned through the removal of a damaged surface layer and oxidized layer at a high temperature of about 1000° C. in an $H_2$ atmosphere.

Then, while $H_2$ as a carrier gas is being drawn into the apparatus at the rate of 10 L/min, at 900° C. $NH_3$ at the rate of 5 L/min, TMG at the rate of 50 μmol/min and $SiH_4$ as Si dopant gas for n-type are each introduced into the apparatus, to grow light extracting layer 19 having an irregular structure of n-type GaN of 400 nm in the maximum thickness. At the temperature of 900° C., it is possible to fabricate light extracting layer 19 with irregular structure having numerous holes, through the increase in the growth speed of light extracting layer 19 or the decrease in the amount of $NH_3$ gas introduction.

On a portion of the wafer including nitride-based semiconductor layers having irregularities thus formed according to the technique as described above, n electrode 110 and bonding electrode 111 are formed. Finally, the wafer is cut into 300 μm×300 μm square by a dicing apparatus to give a finish to the nitride-based semiconductor light-emitting device of the embodiment.

As described above, on a high-workability Si substrate, nitride-based semiconductor layers are epitaxially grown and a high-reflectivity electrode is provided on the side of p-type GaN, then a wafer including these layers is inverted using support substrate 11, and irregularities of the same nitride crystal are formed on the side of n-type GaN layer, whereby a nitride-based semiconductor light-emitting device with high light extraction efficiency and high brightness without unfavorable electric conductivity can be fabricated.

Second Embodiment

Figure 4:
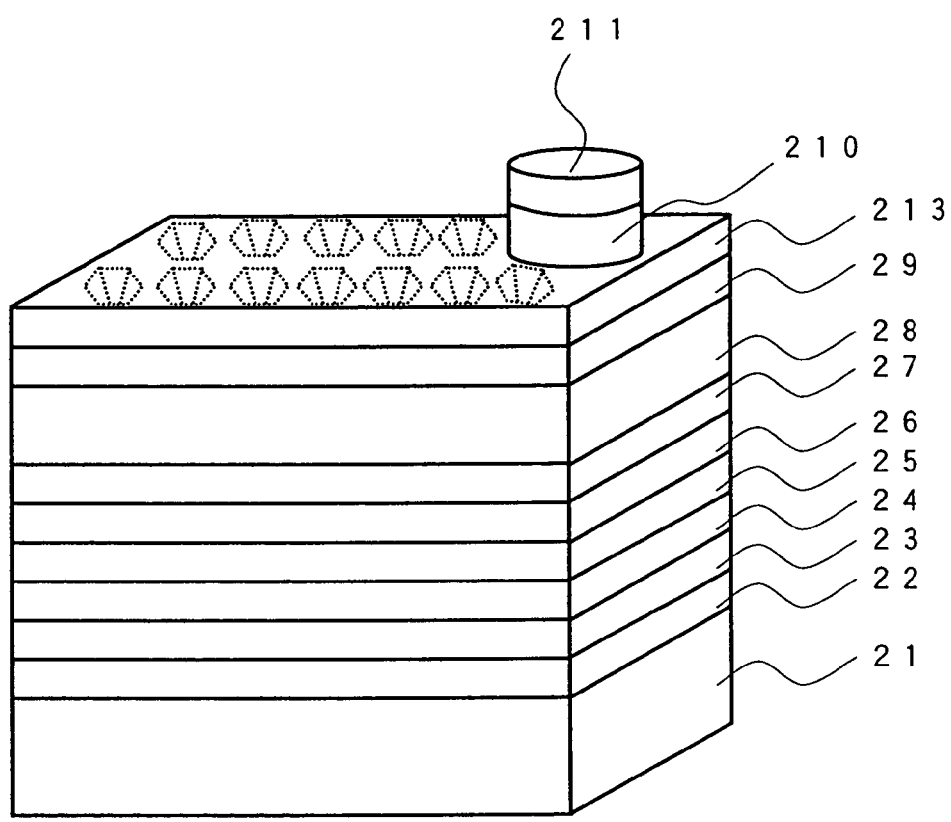
FIG. 4 is a schematic perspective of a nitride-based semiconductor light-emitting device of a second embodiment.

FIG. 4 shows a schematic perspective of a nitride-based semiconductor light-emitting device of the second embodiment of the present invention. The nitride-based semiconductor light-emitting device of the embodiment is characterized in that an Al translucent electrode layer 213 is formed through vapor deposition on an upper surface of n-type GaN light extracting layer 29 having irregularities.

The nitride-based semiconductor light-emitting device of the embodiment includes on a support substrate 21 of Ni plating functioning also as an electrode, a p-type-use electrode 22, and further a p-type GaN clad layer 23, a p-type AlGaInN carrier block layer 24, an $In_xGa_{1-x}N$ light-emitting layer 25, an Si-doped n-type $In_{0.03}Ga_{0.97}N$ clad layer 26, an Si-doped n-type $In_{0.1}Ga_{0.9}N$ layer 27 and an Si-doped n-type GaN layer clad layer 28 successively formed on p-type-use electrode 22. Further on n-type GaN clad layer 28, an n-type GaN light extracting layer 29 is formed to have irregularities fabricated through the regrowth.

Further, in the nitride-based semiconductor light-emitting device of the second embodiment, a translucent electrode layer 213 of Al is formed through vapor deposition on an upper surface of n-type GaN light extracting layer 29 with irregularities and on a portion of the upper surface of translucent electrode layer 213 an n-type-use electrode 210, an n-type-use bonding electrode 211 are formed. Also in the second embodiment, a nitride-based semiconductor light-emitting device with high light extraction efficiency, low driving voltage and high brightness can be manufactured. In other respects, the second embodiment is same as the first embodiment.

Third Embodiment

Figure 5:
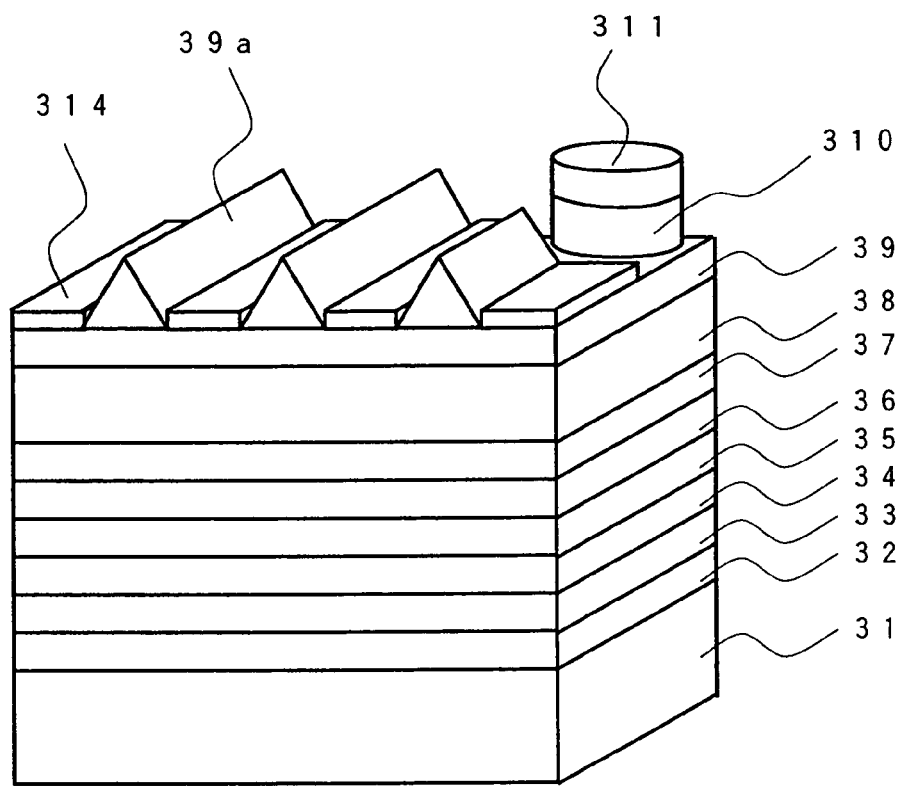
FIG. 5 is a schematic perspective of a nitride-based semiconductor light-emitting device of a third embodiment.

FIG. 5 shows a schematic perspective of a nitride-based semiconductor light-emitting device of the third embodiment of the present invention. The nitride-based semiconductor light-emitting device of the embodiment is characterized in that an $SiO_2$ mask 314 is formed above an upper surface of Si-doped n-type GaN layer clad layer 38 and that a pyramid-shaped light extracting surface 39a is formed in an n-type GaN light extracting layer 39 which is selectively grown.

The nitride-based semiconductor light-emitting device of the embodiment includes on a support substrate 31 of Ni plating functioning also as an electrode, a p-type-use electrode 32, and further, a p-type GaN clad layer 33, a p-type AlGaInN carrier block layer 34, an $In_xGa_{1-x}N$ light-emitting layer 35, an Si-doped n-type $In_{0.03}Ga_{0.97}N$ clad layer 36, an Si-doped n-type $In_{0.1}Ga_{0.9}N$ layer 37 and an Si-doped n-type GaN layer clad layer 38 successively formed on p-type-use electrode 32. Further on an upper surface of n-type GaN clad layer 38, an n-type GaN light extracting layer 39 having irregularities fabricated through the regrowth is formed. On a portion of n-type GaN light extracting layer 39, an n-type-use electrode 310, an n-type-use bonding electrode 311 are formed. Further, above an upper surface of n-type GaN layer clad layer 38, an $SiO_2$ mask 314 is formed and a pyramid-shaped light extracting surface 39a which is selectively formed is formed on n-type GaN light extracting layer 39. In this embodiment as described above, a nitride-based semiconductor light-emitting device with high light extraction efficiency, low driving voltage, and high brightness can be manufactured. In other respects the third embodiment is same with the first embodiment.

Fourth Embodiment

Figure 6:
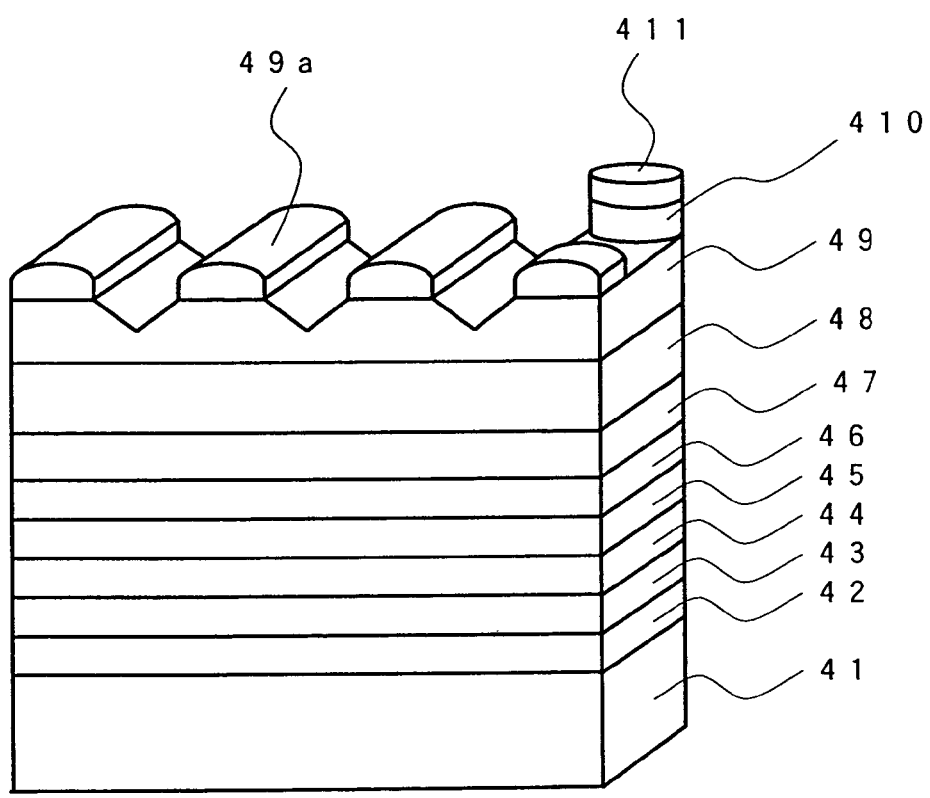
FIG. 6 is a schematic perspective of a nitride-based semiconductor light-emitting device of a fourth embodiment.

FIG. 6 shows a schematic perspective of a nitride-based semiconductor light-emitting device of the fourth embodiment of the present invention. The nitride-based semiconductor light-emitting device of the fourth embodiment is characterized in that a barrel roof shaped light extracting surface 49a is formed on n-type GaN light extracting layer 49 and that there is a taper structure in the space between light extracting surfaces 49a.

The nitride-based semiconductor light-emitting device of the embodiment includes on a support substrate 41 of Ni plating functioning also as an electrode, a p-type-use electrode 42, and further on p-type-use electrode 42, a p-type GaN clad layer 43, a p-type AlGaInN carrier block layer 44, an $In_xGa_{1-x}N$ light-emitting layer 45, an Si-doped n-type $In_{0.03}Ga_{0.97}N$ clad layer 46, an Si-doped n-type $In_{0.1}Ga_{0.9}N$ layer 47 and an Si-doped n-type GaN layer clad layer 48 successively formed. Further, an n-type GaN light extracting layer 49 is formed on an upper surface of n-type GaN clad layer 48. On a portion of n-type GaN light extracting layer 49, an n-type-use electrode 410 and an n-type-use bonding electrode 411 are formed. Still further, a barrel roof shaped light extracting surface 49a is formed on n-type GaN light extracting layer 49 and that there is a taper structure in the space between light extracting surfaces 49a.

Barrel roof shaped light extracting surface 49a is fabricated as follows. First, a mask pattern of stripes of about 1 μm width is formed on n-type GaN light extracting surface 49, then heat treatment at 180° C. is performed for 30 minutes to deform the mask pattern into a barrel roof shape. Then, through a vertical etching with RIE, the barrel roof shape is projected onto n-type GaN light extracting layer 49 and barrel roof shaped light extracting surface 49a is fabricated. Also in the fourth embodiment, a nitride-based semiconductor light-emitting device with high light extraction efficiency, low driving voltage and high brightness can be manufactured. In other respects, the fourth embodiment is same as the first embodiment.

Fifth Embodiment

Figure 7:
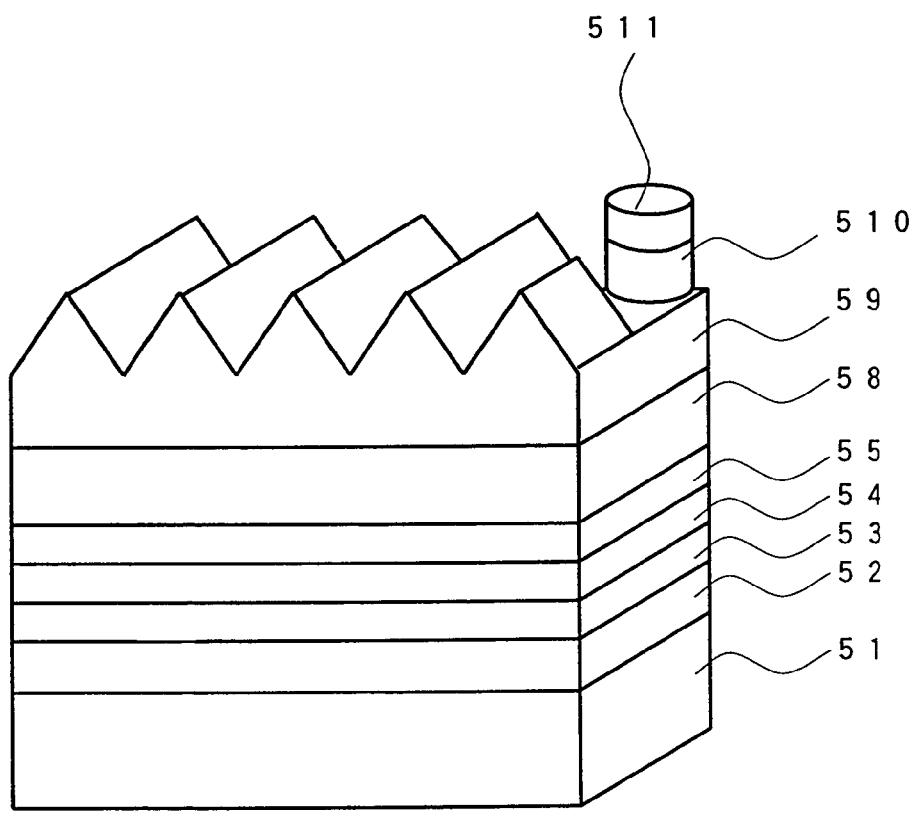
FIG. 7 is a schematic perspective of a nitride-based semiconductor light-emitting device of a fifth embodiment.

FIG. 7 shows a schematic perspective of a nitride-based semiconductor light-emitting device of the fifth embodiment of the present invention. The nitride-based semiconductor light-emitting device of the fifth embodiment is characterized in that n-type GaN light extracting layer 59 is formed in a prism shape.

The nitride-based semiconductor light-emitting device of the embodiment includes on a support substrate 51 of Ni plating functioning also as an electrode, a p-type-use electrode 52, and further on p-type-use electrode 52, a p-type GaN clad layer 53, a p-type $Al_{0.20}Ga_{0.75}In_{0.05}N$ carrier block layer 54, a light-emitting layer 55 and an Si-doped n-type GaN layer clad layer 58 successively formed, and on an upper surface of n-type GaN clad layer 58 an n-type GaN light extracting layer 59 having irregularities fabricated through the regrowth is formed in a prism shape. On a portion of n-type GaN light extracting layer 59, an n-type-use electrode 510 and an n-type-use bonding electrode 511 are formed.

In the following, the method of manufacturing the nitride-based semiconductor light-emitting device of the embodiment will be described. First, FIG. 8A shows a relation between a (001) main surface 60 of Si substrate 20 and a (111) facet surface 61, and FIG. 8B and FIG. 8C are a sectional view and a conceptual drawing, respectively, showing a relation between a (001) surface 7.3° off Si substrate 20 and the nitride semiconductor film having (111) facet surface 61 and a (1-01) facet surface 70.

Figure 8A:
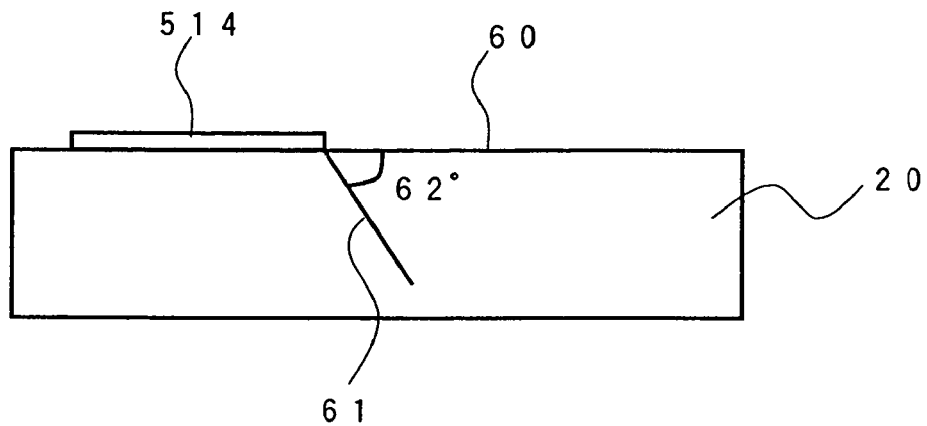
FIGS. 8A~8C are schematic drawings conceptually showing a relation between the Si substrate and a facet surface.
Figure 8B:
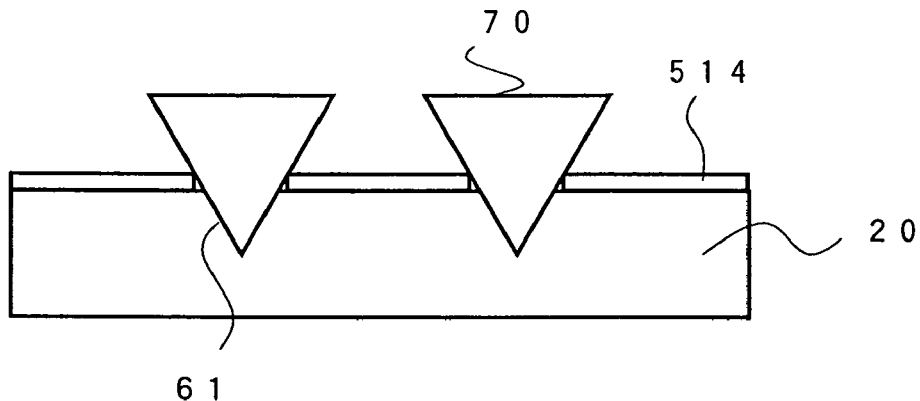
Figure 8C:
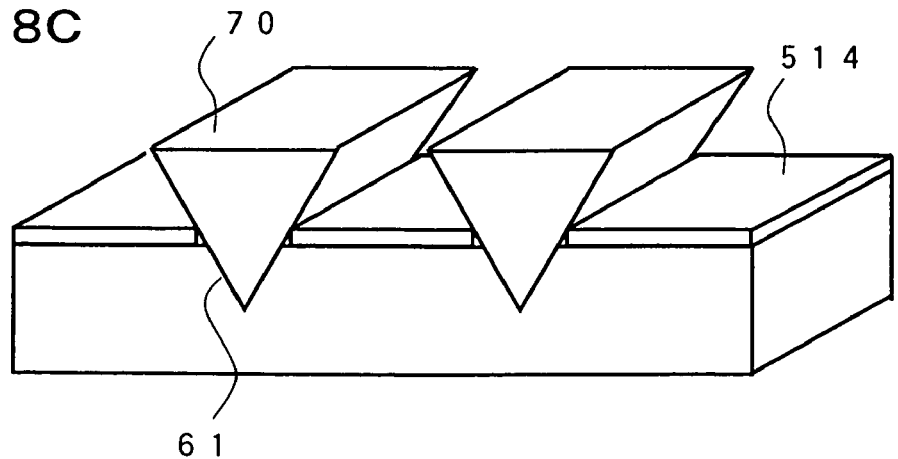
Figure 9A:
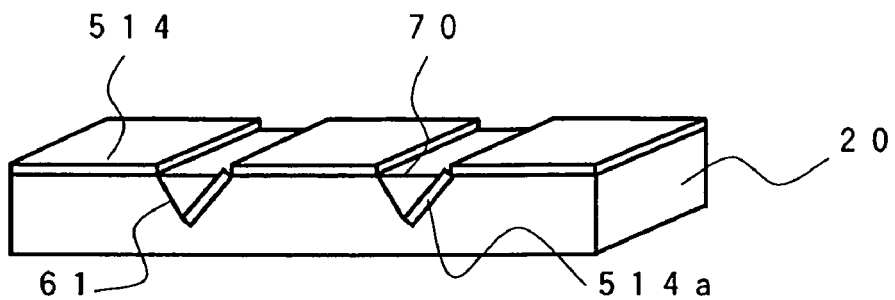
FIGS. 9A~9D are schematic drawings showing a process of crystal growth of a nitride-based semiconductor film.
Figure 9B:
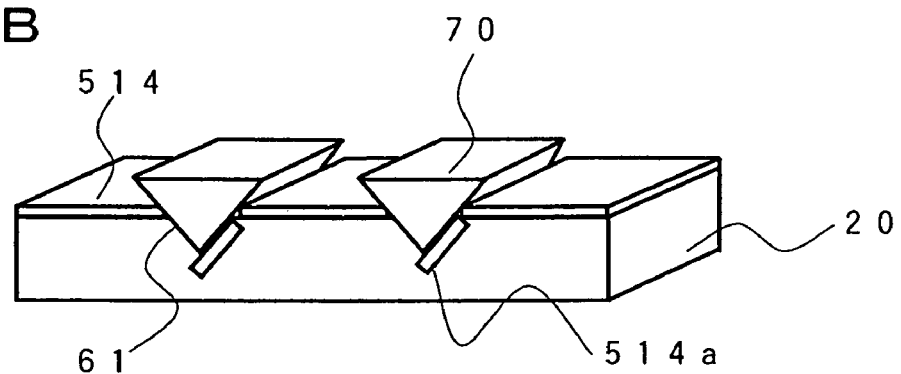
Figure 9C:
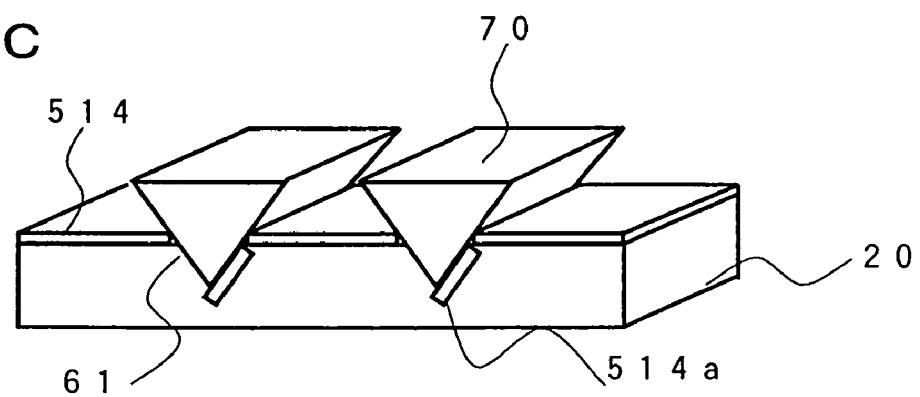
Figure 9D:
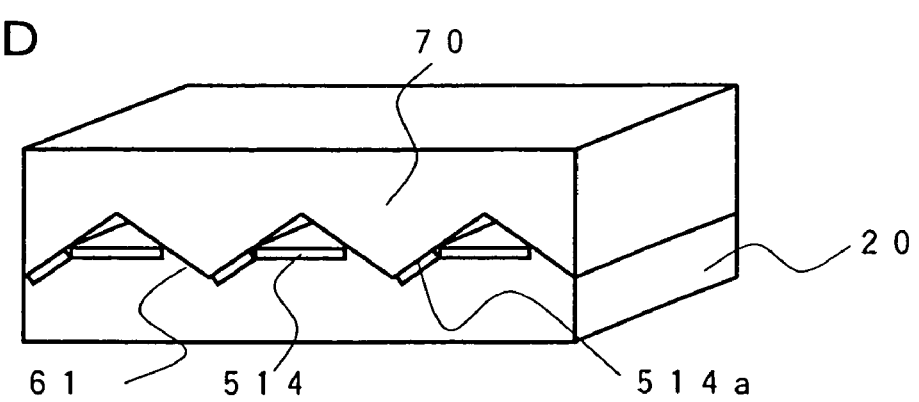

As FIGS. 8A~8C show, a partial masking of $SiO_2$ 514 is provided onto Si substrate 20 rotating by 7.3° about a [01-1] axis from (001) main surface 60 or onto a surface off from this surface in an optional direction by degrees not more than 3°, and etching is performed on an opening where a mask of $SiO_2$ 514 is not applied. Then a groove with (111) facet surface 61 forming an angle of 62° with (001) main surface 60 is formed and on this surface a nitride-based semiconductor film is epitaxially grown to provide a GaN-based semiconductor film having a facet surface 70 as a growth surface.

Si substrate 20 employed here has a main surface 60 which is tilted in [0-1-1] direction by 7.3° from (001) main surface 60, in other words, main surface 60 rotating by 7.3° about [01-1] axis from (001) main surface 60. Hence, (1-10) facet surface 70 has nearly the same surface direction with main surface 60 of Si substrate 20. When there is a tilt not more than 3° in an optional direction from this surface, a fairly flat surface including (1-101) surface can be obtained.

Then, in the order of FIG. 9A, FIG. 9B, FIG. 9C and FIG. 9D, a crystal growth of a nitride-based semiconductor film is proceeded only on the groove, nitride-based semiconductor layers are formed successively and further a p-type electrode 52 and Ni plating 51 as a support substrate are formed thereon. Then Si substrate 20 is removed to finish the nitride-based semiconductor light-emitting device of the embodiment using the light extracting surface with prism-shape irregularities formed with (111) facet surface 61 of Si substrate 20.

Figure 10A:
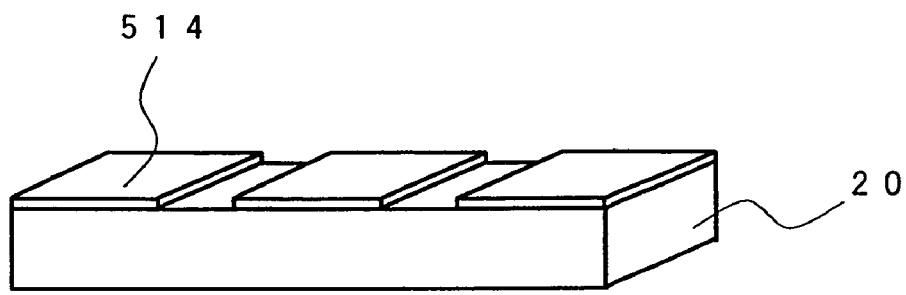
FIGS. 10A~10C are schematic drawings conceptually showing an example of a process of forming a facet surface through the removal of a portion of the Si substrate.
Figure 10B:
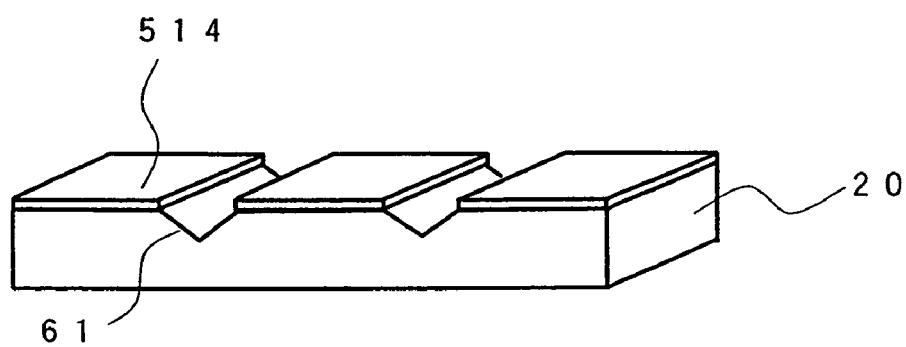
Figure 10C:
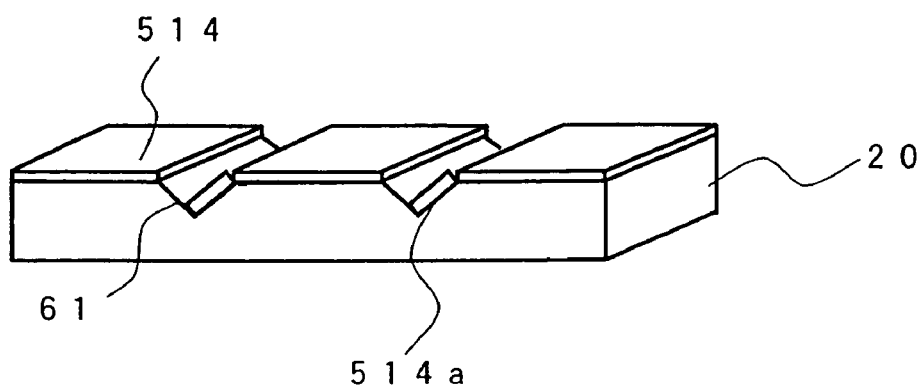

In the following, detailed description will be given. First, Si substrate as described above is cleaned and $SiO_2$ mask 514 of 100 nm is deposited thereon as shown in FIG. 10A by sputtering or CVD. By photolithography, $SiO_2$ mask 514 is partially removed in stripe-shape. Then through the process such as acid etching using, for example, buffered hydrofluoric acid, on wafer, a groove with (111) facet surface 61 is formed as shown in FIG. 10B. The groove is of stripe shape and extends in [01-1] direction of Si substrate 20. Here, the angle formed by main surface 60 of Si substrate 20 and (111) facet surface 61 is about 620. Then, as shown in FIG. 10C, on an opposite surface of (111) facet surface 61, $SiO_2$ mask 514a is formed.

Next, through MOCVD (metal-organic chemical vapor deposition) on facet surface 61 of Si substrate 20, the nitride semiconductor film is grown under the following growth conditions. The following is the detailed description.

First, silicon substrate 20 with grooves formed through the process as described above is introduced into a MOCVD apparatus and cleaned at a high temperature of approximately 1100° C. in an atmosphere of $H_2$.

Figure 11A:
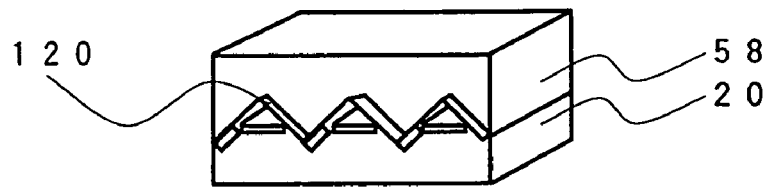
FIGS. 11A~11D are schematic drawings conceptually showing an example of a process of manufacturing a nitride-based light-emitting device of the fifth embodiment.

Then, while $H_2$ as a carrier gas is being drawn into the apparatus at the rate of 10 L/min, at 800° C. $NH_3$ at the rate of 5 L/min and TMA at the rate of 10 μmol/min are introduced into the apparatus to grow an AlN buffer layer 120 of about 50 nm in thickness as shown in FIG. 11A, and then at the same temperature, the supply of TMA is stopped and TMG at the rate of about 20 μmol/min and $SiH_4$ gas at the rate of 0.05 μmol/min are introduced into the apparatus to grow Si-doped n-type GaN clad layer 58 of about 3 μm in thickness.

Figure 11B:
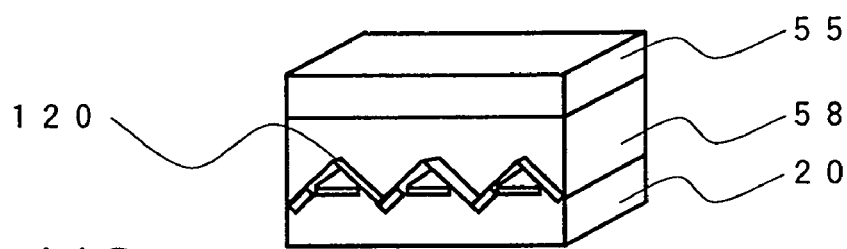

Then, the supply of TMA, TMI, TMG and $SiH_4$ is stopped, the substrate temperature is decreased down to 760° C., TMI at the rate of 6.5 μmol/min and TMG at the rate of 2.8 μmol/min are introduced into the apparatus to grow a well layer of $In_{0.18}Ga_{0.82}N$ of 3 nm in thickness. Then again the temperature is raised up to 850° C. and TMG is introduced into the apparatus at the rate of 14 μmol/min to grow a barrier layer of GaN. Similarly the growth of well layer and barrier layer is repeated to grow a light-emitting layer 55 of multiple quantum well (MQW) including four pairs of well layer and barrier layer as shown in FIG. 11B.

Figure 11C:
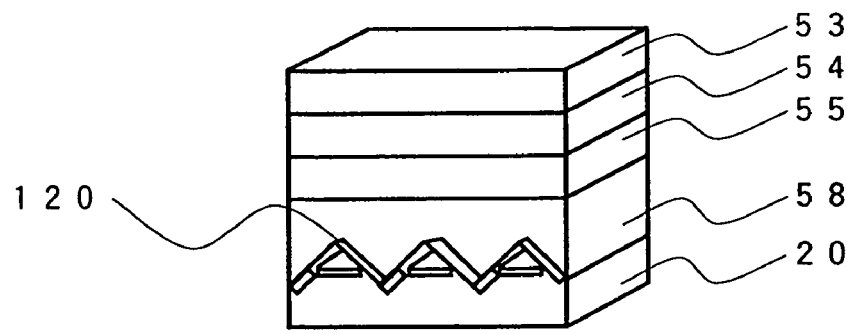

After the completion of the growth of the light-emitting layer, at the same temperature as the last barrier layer, TMG at the rate of 11 μmol/min, TMA at the rate of 1.1 μmol/min, TMI at the rate of 40 μmol/min and $Cp_2Mg$ at the rate of 10 nmol/min are introduced into the apparatus to grow a p-type $Al_{0.20}Ga_{0.75}In_{0.05}N$ carrier block layer 54 of 50 nm in thickness. Next, after the completion of the growth of p-type $Al_{0.20}Ga_{0.75}In_{0.05}N$ carrier block layer 54, the supply of TMA is stopped at the same temperature and p-type $In_{0.1}Ga_{0.9}N$ clad layer 53 is grown and the growth of these nitride-based semiconductor layers is finished at the stage shown in FIG. 11C. Thereafter, the supply of TMG, TMI and $Cp_2Mg$ is stopped, the temperature is cooled down to room temperature, and the wafer including these nitride-based semiconductor layers is removed out of the MOCVD apparatus.

Figure 11D:
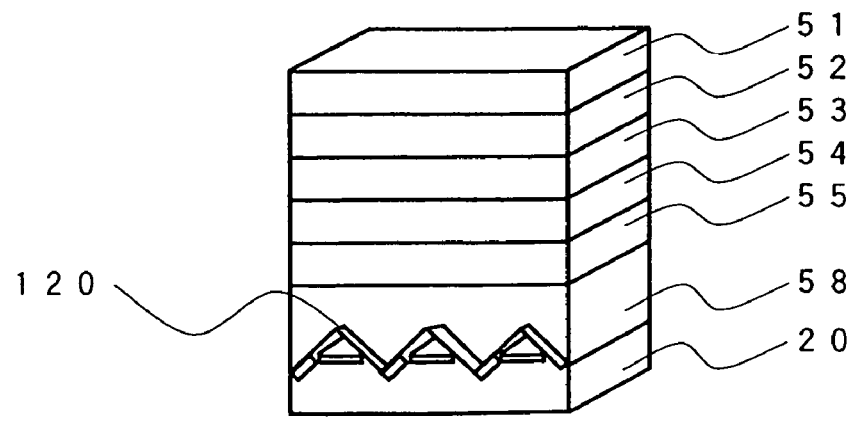
Figure 12:
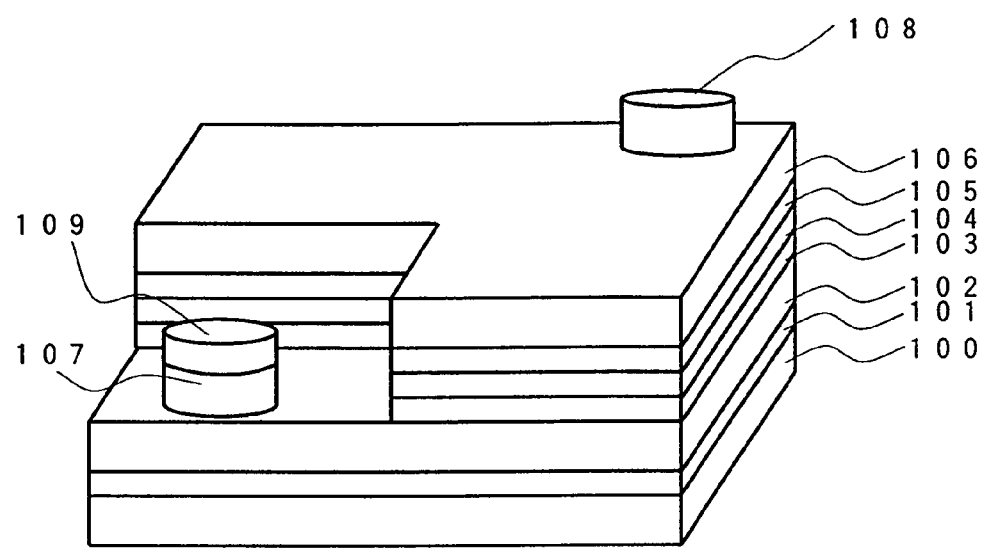
FIG. 12 is a schematic perspective of a conventional nitride-based semiconductor light-emitting device.

Under the growth conditions as described above, on the nitride-based semiconductor layers fabricated on Si substrate 20, p-type-use electrode 52 of 100 nm in thickness is vapor deposited by Electron Beam (EB) vapor deposition apparatus. On p-type-use electrode 52, Ni plating is performed to 100 μm to provide a support substrate 51 as shown in FIG. 11D.

Sequentially, Si substrate 20 on the side of n-type GaN clad layer 58 is removed through the etching with hydrofluoric acid-based etchant, and further, to increase the conductivity on the side of n-type-GaN, low crystallinity layer adjacent to an interface of Si substrate and AlN buffer layer 120 are removed with an RIE apparatus to form a prism shaped light extracting layer 59. Finally on light extracting layer 59, n electrode 510 and bonding electrode 511 are partially formed and the obtained wafer is divided into 300 μm square pieces. Also in the fifth embodiment, a nitride-based semiconductor light-emitting device with high light extraction efficiency, low driving voltage and high brightness can be manufactured.

(First Comparison)

In the configuration of the nitride-based semiconductor light-emitting device of the first embodiment, light extracting surface 19 is not formed and an n-type-use electrode 110 is directly provided on n-type GaN layer clad layer 18 to provide a nitride-based semiconductor light-emitting device of the first comparison.

(Second Comparison)

In the configuration of the nitride-based semiconductor light-emitting device of the first embodiment, n-type and p-type are exchanged to provide a nitride-based semiconductor light-emitting device of the second comparison.

(Measurement Results)

Measurements are performed on the driving voltages and the light extraction efficiency of the nitride-based semiconductor light-emitting devices of first to fifth embodiments and first to second comparisons. The table below shows the measurement results of the nitride-based semiconductor light-emitting devices of first to fifth embodiments and first to second comparisons.

TABLE 1

|  | Embodiments ||||| Comparisons ||
| --- | --- | --- | --- | --- | --- | --- | --- |
|  | 1 | 2 | 3 | 4 | 5 | 1 | 2 |
| Driving Voltage (V) | 3.5 | 3.5 | 3.5 | 3.5 | 3.5 | 3.5 | 4.5 |
| Light Extraction Efficiency (mW) | 2.0 | 2.0 | 2.0 | 2.0 | 2.0 | 1.5 | 2.0 |

As can be seen from Table 1, the nitride-based semiconductor light-emitting devices of first to fifth embodiments are equal to the nitride-based semiconductor light-emitting device of the first comparison in driving voltage, which is 3.5V. However, the light extraction efficiency of the nitride-based semiconductor light-emitting devices of first to fifth embodiments is 2.0 mW whereas the light extraction efficiency of the nitride-based semiconductor light-emitting device of the first comparison is 1.5 mW. Thus, the nitride-based semiconductor light-emitting devices of first to fifth embodiments are superior to the nitride-based semiconductor light-emitting device of the first comparison in light extraction efficiency.

In addition, the driving voltage of the nitride-based semiconductor light-emitting devices of first to fifth embodiments is 3.5V whereas the driving voltage of the nitride-based semiconductor light-emitting device of the second comparison is 4.5V, which means that the nitride-based semiconductor light-emitting devices of first to fifth embodiments can decrease the driving voltage compared with the nitride-based semiconductor light-emitting device of the second comparison.

In the present invention as described above, on the Si substrate with high workability, nitride-based semiconductor layers are epitaxially grown and a high reflectivity electrode is provided on the side of the p-type nitride-based semiconductor layer. Then the wafer is inverted with the use of the support substrate and irregularities are provided on the side of the high conductivity n-type nitride-based semiconductor layer, whereby the nitride-based semiconductor light-emitting device with low driving voltage, high light extraction efficiency and high brightness can be manufactured.

Although the present invention has been described and illustrated in detail, it is clearly understood that the same is by way of illustration and example only and is not to be taken by way of limitation, the spirit and scope of the present invention being limited only by the terms of the appended claims.

We claim:

1. A method of manufacturing a nitride-based semiconductor light-emitting device comprising:
   providing a support substrate, a reflective layer, a p-type nitride-based semiconductor layer, a light-emitting layer, an n-type nitride-based semiconductor layer and an n-type $In_aGa_{1-a}N$ ($0 \leq a \leq 1$) layer layered in this order, wherein the light-emitting layer, the n-type nitride-based semiconductor layer and the n-type $In_aGa_{1-a}N$ ($0 \leq a \leq 1$) layer are formed using a growth substrate;
   forming irregularities on a light extraction surface on an upper surface of said n-type $In_aGa_{1-a}N$ ($0 \leq a \leq 1$) layer by removing the growth substrate; and
   providing an n-type electrode on the upper surface of the n-type $In_aGa_{1-a}N$ ($0 \leq a \leq 1$) layer;
   wherein, the reflective layer is in ohmic contact with the p-type nitride-based semiconductor layer and functions as a p-type-use electrode; and
   the p-type use electrode is a layer or a stack selected from a group consisting of a Pd layer, an Ag layer, a stack of a Pd layer and an Au layer, a stack of an Ag layer and an Au layer, and a stack of a Pd layer, an Ag layer and an Au layer.

2. The method according to claim 1, wherein the n-type $In_aGa_{1-a}N$ ($0 \leq a \leq 1$) layer is a silicon-doped nitride-based semiconductor layer.

3. The method according to claim 1, wherein the support substrate comprises a nickel provided by nickel plating, a metal provided by metal plating, Au, an alloy of Au and Sn, or an electrically-conductive semiconductor.

* * * * *